United States Patent
Kim et al.

(10) Patent No.: US 10,818,936 B2
(45) Date of Patent: *Oct. 27, 2020

(54) SEPARATOR FOR FUEL CELL AND COATING METHOD THEREOF

(71) Applicants: HYUNDAI MOTOR COMPANY, Seoul (KR); KIA MOTORS CORPORATION, Seoul (KR)

(72) Inventors: Bokyung Kim, Yongin-si (KR); Yoo Chang Yang, Gunpo-si (KR); Woong Pyo Hong, Yongin-si (KR); Seungkoo Lee, Yongin-si (KR); Jungyeon Park, Yongin-si (KR); Su Jung Noh, Seoul (KR); Seung Jeong Oh, Suwon-si (KR); Daeil Yoon, Yongin-si (KR); In Woong Lyo, Suwon-si (KR); Kyungmin Kim, Namyangju-si (KR)

(73) Assignees: HYUNDAI MOTOR COMPANY, Seoul (KR); DONGWOO HST CO., LTD., Siheung-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/807,377

(22) Filed: Nov. 8, 2017

(65) Prior Publication Data

US 2019/0058201 A1 Feb. 21, 2019

(30) Foreign Application Priority Data

Aug. 16, 2017 (KR) .......................... 10-2017-0103407

(51) Int. Cl.
 *H01M 8/0228* (2016.01)
 *H01M 8/0213* (2016.01)
 *H01M 8/021* (2016.01)
 *C23C 16/505* (2006.01)
 *H01M 8/0206* (2016.01)
 *C23C 16/26* (2006.01)

(52) U.S. Cl.
 CPC .......... *H01M 8/0228* (2013.01); *C23C 16/26* (2013.01); *C23C 16/505* (2013.01); *H01M 8/021* (2013.01); *H01M 8/0206* (2013.01); *H01M 8/0213* (2013.01)

(58) Field of Classification Search
 CPC ............. H01M 8/0202; H01M 8/0206; H01M 8/0213; H01M 8/0228; H01M 8/0234; H01M 8/0267; H01M 8/0258; H01M 2300/0082; H01M 8/0239; H01M 8/0243; H01M 8/04291
 See application file for complete search history.

(56) References Cited

U.S. PATENT DOCUMENTS 8,735,016 B2   5/2014   Abd Elhamid et al.
9,045,328 B2   6/2015   Liu et al.
(Continued)

FOREIGN PATENT DOCUMENTS

KR       10-1150446 B1    6/2012

*Primary Examiner* — Adam A Arciero
(74) *Attorney, Agent, or Firm* — Morgan, Lewis & Bockius LLP

(57) ABSTRACT

A separator for a fuel cell includes: a metal base material; and a carbon coating layer formed on one surface or both surfaces of the metal base material, in which roughness Ra formed at an interface between the metal base material and the carbon coating layer may be in a range of 20 to 78 nm.

6 Claims, 6 Drawing Sheets

(56) References Cited

U.S. PATENT DOCUMENTS

| | | | |
|---|---|---|---|
| 2002/0034672 A1* | 3/2002 | Saito | H01M 8/0228 |
| | | | 429/413 |
| 2008/0023320 A1* | 1/2008 | Kobayashi | H01M 8/0206 |
| | | | 204/192.32 |
| 2013/0017432 A1* | 1/2013 | Roumi | H01M 2/1686 |
| | | | 429/145 |
| 2014/0004443 A1* | 1/2014 | Hong | H01M 8/1067 |
| | | | 429/482 |
| 2018/0112306 A1* | 4/2018 | Lee | C23C 16/0227 |

\* cited by examiner

SEPARATOR FOR FUEL CELL AND COATING METHOD THEREOF

CROSS-REFERENCE TO RELATED APPLICATION

This application is based on and claims the benefit of priority to Korean Patent Application No. 10-2017-0103407 filed on Aug. 16, 2017 with the Korean Intellectual Property Office, the entire contents of which are incorporated herein by reference.

TECHNICAL FIELD

The present disclosure relates to a separator for a fuel cell and a coating method thereof.

BACKGROUND

A fuel cell stack may be divided into repeatedly stacked parts, such as an electrode membrane, a separator, a gas diffusion layer, and a gasket, and non-repeated parts, such as an engaging system required for the engagement of a stack module, an encloser for protecting a stack, a part required for providing an interface with a vehicle, and a high voltage connector. A fuel cell stack is a system in which hydrogen reacts with oxygen in air to produce electricity, water, and heat. In the fuel cell stack, high-voltage electricity, water, and hydrogen coexist in the same place, and thus there is a large number of dangerous hazards.

Particularly, in the case of a fuel cell separator, since positive hydrogen ions generated during the operation of a fuel cell directly contact therewith, an anti-corrosive property is highly required. When using a metal separator without surface treatment, metal corrosion occurs and an oxide produced on the metal surface functions as an electrical insulator, leading to degradation of electroconductivity. In addition, the positive metal ions dissociated and released at that time contaminate an MEA (membrane electrode assembly), resulting in degradation of the performance of the fuel cell.

The fuel cell separator, which is the most important component part of the fuel cell stack, requires low contact resistance and high corrosion resistance. As a fuel cell separator, a metal separator has excellent electrical conductivity, but it is easily corroded so that durability of the separator deteriorates, thus efforts are being made to solve the corrosion characteristics through coating of the separator.

As a coating material, there are noble metals such as Au, Pt, and the like that do not form an oxide film or a passivation film on a surface thereof, but since they are very expensive materials, they are not practical. On the other hand, a carbon coating has excellent electrical conductivity and low corrosion characteristics, thus the carbon coating is being studied as an alternative.

A water discharge characteristic is also importantly required for the separator because smooth discharge of water generated while the fuel cell operates improves performance of the fuel cell. The water discharge characteristic is improved through hydrophilic or hydrophobic surface treatment for the separator, but in this case, conductivity and corrosion are deteriorated. In addition, a method of performing a texturing process to provide surface roughness is proposed, but process efficiency is degraded because the texturing process is additionally required.

The above information disclosed in this Background section is only for enhancement of understanding of the background of the invention and therefore it may contain information that does not form the prior art that is already known in this country to a person of ordinary skill in the art.

SUMMARY

The present disclosure has been made in an effort to provide a separator for a fuel cell that may improve a water discharge characteristic while maintaining electrical conductivity and corrosion resistance.

In addition, the present disclosure has been made in an effort to provide a coating method of a separator for a fuel cell that that may improve a water discharge characteristic while maintaining electrical conductivity and corrosion resistance.

An exemplary embodiment of the present disclosure provides a separator for a fuel cell, including: a metal base material; and a carbon coating layer formed on one surface or both surfaces of the metal base material, wherein roughness Ra formed at an interface between the metal base material and the carbon coating layer may be in a range of 20 to 78 nm.

A contact angle of the carbon coating layer with respect to water may be in a range of 65 to 80°.

Contact angle hysteresis of the carbon coating layer with respect to water may be equal to or less than 20°.

A thickness of the carbon coating layer may be equal to or less than 1 μm.

The metal base material may include an ion permeating layer including carbon diffusion interfering ions. The ion permeating layer may be formed from a surface of the metal base material in an inner direction thereof.

Another embodiment of the present disclosure provides a manufacturing method of a separator for a fuel cell, including: loading a metal base material into a chamber; introducing a mixed gas containing a reactive gas and an inert gas into the chamber and etching a surface of the metal base material by applying an ion gun; and forming a carbon coating layer on the surface of the metal base material by introducing a carbon precursor gas into the chamber and converting it into a plasma state. In the etching of the surface of the metal base material, the mixed gas may include 25 to 50 vol % of the inert gas and 50 to 75 vol % of the reactive gas.

In the etching of the surface of the metal base material, power of the ion gun may be in a range of 3 to 20 kW.

In the etching of the surface of the metal base material, an amount of the mixed gas may be in a range of 60 to 100 sccm.

In the etching of the surface of the metal base material, the reactive gas may include at least one of hydrogen ($H_2$), tetrafluoromethane ($CF_4$), and chlorine ($Cl_2$), and the inert gas may include at least one of nitrogen ($N_2$) and argon (Ar).

In the etching of the surface of the metal base material and in the forming of the carbon coating layer, a vacuum degree of the chamber may be equal to or less than 1 mbar.

In the etching of the surface of the metal base material and in the forming of the carbon coating layer, a temperature of the chamber may be in a range of 200 to 500° C.

The manufacturing method of the separator for the fuel cell may further include, after the etching of the surface of the metal base material, forming an ion permeating layer from the surface of the metal base material in an inner direction of the metal base material.

The manufacturing method of the separator for the fuel cell may further include, after the forming of the carbon coating layer, cooling the separator.

A starting temperature of the cooling may be in a range of 200 to 500° C., and a termination temperature thereof may be in a range of 10 to 150° C.

The cooling may be performed in an inert gas atmosphere.

According to the separator for the fuel cell of the exemplary embodiment of the present disclosure, roughness Ra is appropriately formed at an interface between a metal base material and a carbon coating layer to improve adhesion between the metal base material and the carbon coating layer and also to improve a corrosion characteristic.

According to the separator for the fuel cell of the exemplary embodiment of the present disclosure, since roughness Ra is appropriately formed at an interface between a metal base material and a carbon coating layer, contact angle hysteresis is small, and a water discharge characteristic is improved.

DETAILED DESCRIPTION

Figure 1:
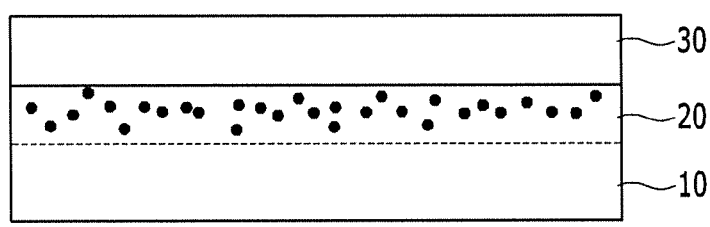
FIG. 1 illustrates a schematic cross-sectional view of a separator for a fuel cell according to an exemplary embodiment of the present disclosure.

The advantages and features of the present disclosure and the methods for accomplishing the same will be apparent from the exemplary embodiments described hereinafter with reference to the accompanying drawings. However, the present disclosure is not limited to the exemplary embodiments described hereinafter, and may be embodied in many different forms. The following exemplary embodiments are provided to make the disclosure of the present disclosure complete and to allow those skilled in the art to clearly understand the scope of the present disclosure, and the present disclosure is defined only by the scope of the appended claims. Throughout the specification, the same reference numerals denote the same constituent elements.

When a part is referred to as being "on" another part, it can be directly on the other part or intervening parts may also be present. In contrast, when an element is referred to as being "directly on" another element, there are no intervening elements therebetween.

In some exemplary embodiments, detailed description of well-known technologies will be omitted to prevent the disclosure of the present disclosure from being interpreted ambiguously. Unless otherwise defined, all terms (including technical and scientific terms) used herein have the same meaning as commonly understood by one of ordinary skill in the art. In addition, throughout the specification, unless explicitly described to the contrary, the word "comprise" and variations such as "comprises" or "comprising" will be understood to imply the inclusion of stated elements but not the exclusion of any other elements. Further, as used herein, the singular forms "a", "an", and "the" are intended to include the plural forms as well, unless the context clearly indicates otherwise.

FIG. 1 illustrates a schematic cross-sectional view of a separator for a fuel cell according to an exemplary embodiment of the present disclosure.

Referring to FIG. 1, a separator 100 for a fuel cell includes a metal base material 10 and a carbon coating layer 30 formed on one surface or both surfaces of the metal base material 10. The cross-section of the separator 100 for the fuel cell shown in FIG. 1 is merely exemplary, and the present disclosure is not limited thereto.

Hereinafter, respective components of the separator 100 for the fuel cell will be described in detail.

The metal base material 10 may include metal base materials used in the separator 100 for the fuel cell without limitation. Specifically, it may include machine structural carbon steel, structural alloy steel, stainless steel, micro-alloyed steel, carbon tool steel, alloy tool steel, high speed tool steel, special steel, and plastic-base steel. More specifically, it may include SUS 300-based steel as the stainless steel.

Figure 2:
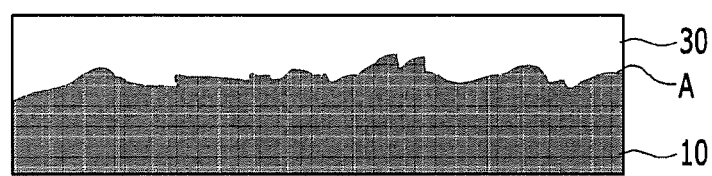
FIG. 2 illustrates an enlarged view of an interface between a metal base material and a carbon coating layer of a separator for a fuel cell according to an exemplary embodiment of the present disclosure.

The carbon coating layer 30 is formed on one surface or both surfaces of the metal base material 10. FIG. 2 illustrates an enlarged view of an interface A between the metal base material 10 and the carbon coating layer 30.

In the exemplary embodiment of the present disclosure, by appropriately controlling roughness Ra formed at the interface A between the metal base material 10 and the carbon coating layer 30, adhesion between the metal base material 10 and the carbon coating layer 30 is improved and the corrosion characteristic is improved. In addition, by appropriately controlling the roughness Ra formed at the interface A between the metal base material 10 and the carbon coating layer 30, the contact angle hysteresis is improved to be small, and the water discharge characteristic is improved. Thus, performance of the fuel cell including the separator 100 is improved. Specifically, the roughness Ra formed at the interface A between the metal base material 10 and the carbon coating layer 30 may be in a range of 20 to 78 nm. When the roughness Ra formed at the interface A is too small, the adhesion between the metal base material 10 and the carbon coating layer 30 may be insufficient. When the roughness Ra formed at the interface A is too large, the contact angle hysteresis becomes large, thus it may be difficult to obtain a proper water discharge characteristic. More specifically, the roughness Ra formed at the interface A between the metal base material 10 and the carbon coating layer 30 may be in a range of 35 to 76 nm. In the exemplary embodiment of the present disclosure, the roughness Ra means an arithmetic mean roughness.

Since the carbon coating layer 30 contains carbon as a main material, a contact angle thereof is in a range of 65 to 80°. In this case, the contact angle means an angle between a solid-liquid interface and a liquid-gas interface when a droplet is positioned on a solid substrate.

In addition, as described above, in the exemplary embodiment of the present disclosure, by appropriately controlling the roughness Ra formed at the interface A between the metal base material 10 and the carbon coating layer 30, it is possible to obtain the carbon coating layer 30 having contact angle hysteresis of 20° or less. The contact angle hysteresis means, in a case that a contact angle is measured when a contact line of solid-liquid-gas moves, an arithmetic difference between an advancing angle corresponding to a contact angle when a contact area of solid-liquid increases (i.e., a droplet size increases) and a receding angle corresponding to a contact angle when the contact area of the solid-liquid decreases (i.e., the droplet size decreases). When the contact angle hysteresis becomes too large, the water discharge characteristic may be degraded, which may adversely affect performance of the fuel cell. More specifically, the contact angle hysteresis with respect to the carbon coating layer 30 may be in a range of 5 to 20°.

A thickness of the carbon coating layer 30 may equal to or less than 1 μm. When the thickness of the carbon coating layer 30 is too thick, the carbon coating layer 30 may be separated from the metal base material 10 by itself due to high residual stress. Specifically, the thickness of the carbon coating layer 30 may be in a range of 10 nm to 1 μm.

In the separator 100 for the fuel cell according to the exemplary embodiment of the present disclosure, the metal base material 10 may include an ion permeating layer 20 containing carbon diffusion interfering ions. The ion permeating layer 20 may be formed from a surface of the metal base material 10 in an inner direction thereof. Since the ion permeating layer 20 is formed from the surface of the metal base material 10 in the inner direction thereof and includes the ion permeating layer 20 containing the carbon diffusion interfering ions to improve bonding strength and density of the carbon coating layer 30, it is possible to achieve low contact resistance and corrosion potential characteristics of the separator 100 for the fuel cell.

When the ion permeating layer 20 containing the carbon diffusion interfering ions is formed, the carbon diffusion interfering ions are interposed between metal atoms. Thereafter, even though carbon atoms are injected to form the carbon coating layer 30, the carbon atoms are prevented from diffusing into the inside of the metal base material 10 by the carbon diffusion interfering ions. Therefore, the carbon atoms are hardly diffused into the inside of the metal base material 10, and a large amount of carbon atoms relatively exist on an outermost surface (i.e., the ion permeating layer 20) of the metal base material 10. The carbon atoms existing on the outermost surface of the metal base material 10 make a carbon-carbon bond with the carbon atoms in the carbon coating layer 30, so that bonding force between the carbon coating layer 30 and the metal base material 10 is improved. In addition, an amount of carbon atoms diffused into the inside of the metal base material 10 is decreased, and an amount of carbon atoms in the carbon coating layer 30 is relatively increased even when the same carbon atoms are supplied, thus density of the carbon coating layer 30 is increased. As such, the bonding force and density of the carbon coating layer 30 are improved, so that the low contact resistance and the corrosion potential characteristic of the separator 100 for the fuel cell may be improved.

As described above, according to the exemplary embodiment of the present disclosure, it is possible to achieve the low contact resistance and the corrosion potential characteristic of the separator 100 for the fuel cell through the formation of the ion permeating layer 20 in which the carbon diffusion interfering ions are interposed between the metal atoms of the base metal material 10. In this case, the metal atoms may be metal atoms existing in the metal base material 10 described above, for example, iron (Fe), chromium (Cr), nickel (Ni), or molybdenum (Mo) atoms. The fact that the carbon diffusion interfering ions are interposed between the metal atoms means that the carbon diffusion interfering ions penetrate or are solidified into the austenite face-centered cubic (FCC) lattice.

The ion permeating layer 20 may include may include 5 to 30 wt % of carbon diffusion interfering ions. When too few carbon diffusion interfering ions are included, the carbon diffusion interfering effect may not be sufficient. When too many carbon diffusion interfering ions are included, delamination may occur due to surface curing when external impact is applied thereto, thus durability may be deteriorated. Therefore, the carbon diffusion interfering ions may be included in the above-mentioned range.

In addition, when the carbon coating layer 30 is formed, the carbon atoms may diffuse into some of the ion permeating layer 20, so that the carbon atoms may be included at 5 to 85 wt % in the ion-permeable layer 20. When too few carbon atoms are included in the ion permeating layer 20, a carbon-carbon bond with the carbon atoms of the carbon coating layer 30 is decreased, thus bonding force of the carbon coating layer 30 may be a problem. When too many carbon atoms are contained in the ion permeating layer 20, density of the carbon coating layer 30 may be decreased. Therefore, the carbon atoms may be included in the above-mentioned range.

The carbon diffusion interfering ions may be used without limitation as long as they may be interposed between metal atoms and interfere with the diffusion of the carbon atoms. Specifically, ions of an element having an atomic number of 20 or less may be used. More specifically, the carbon diffusion interfering ions may include nitrogen or boron ions.

A thickness of the ion permeating layer 20 may be in a range of 30 to 300 nm. When the ion permeating layer 20 is too thin, the carbon diffusion interfering effect may not be sufficient. When the ion permeating layer 20 is too thick, since hardness thereof may increase when nitrogen atoms are excessively penetrated, it may be easily broken by an external impact.

The ion permeating layer 20 may be formed through plasma or ion injection. A specific method of forming the ion permeating layer 20 will be described in detail with reference to a coating method of the separator for the fuel cell to be described later.

The coating method of the separator 100 for the fuel cell according to the exemplary embodiment of the present disclosure includes: loading the metal base material 10 into a chamber; introducing a mixed gas containing a reactive gas and an inert gas into the chamber and etching a surface of the metal base material 10 by applying an ion gun; and introducing a carbon precursor gas into the chamber and converting it to a plasma state to form a carbon coating layer 30 on the surface of the metal base material 10.

Hereinafter, each process will be described in detail.

First, the metal base material 10 is loaded into the chamber. The metal base material 10 may be used without limitation as long as it is used in the separator plate 100 for the fuel cell. Specifically, it may include machine structural carbon steel, structural alloy steel, stainless steel, microalloyed steel, carbon tool steel, alloy tool steel, high speed tool steel, special steel, and plastic-base steel. More specifically, it may include SUS 300-based steel as the stainless steel.

Next, the mixed gas containing the reactive gas and the inert gas is introduced into the chamber, and the surface of the metal base material 10 is etched by applying the ion gun.

An oxide film may exist on the surface of the metal base material 10 due to contact with air or the like. Since the oxide film increases the contact resistance, the oxide film on the surface of the metal base material 10 is eliminated through the etching process. In addition, it is possible to improve the adhesion between the metal base material 10 and the carbon coating layer 30 by forming appropriate roughness Ra on the surface of the metal base material 10 through the etching process.

When the mixed gas containing the reactive gas and the inert gas is introduced into the chamber and then the ion gun is applied thereto, an inert gas plasma is generated such that the oxide film of the metal base material 10 is eliminated, and the roughness Ra is formed on the surface of the metal base material 10.

A method of adjusting a volume ratio of the reactive gas and the inert gas in the mixed gas may be used as a method of appropriately forming the roughness Ra on the surface of the metal base material 10. Specifically, the mixed gas may include 25 to 50 vol % of the inert gas and 50 to 75 vol % of the reactive gas. When the inert gas excessively contained in the mixed gas, strongly accelerated inert ions are unevenly distributed, thus the surface roughness Ra of the metal base material 10 becomes too high. When the inert gas is insufficiently contained in the mixed gas, the oxide film is not properly eliminated or the surface roughness Ra of the metal base material 10 becomes too small. More specifically, the mixed gas may include 30 to 45 vol % of the inert gas and 55 to 70 vol % of the reactive gas. In this case, the reactive gas may include at least one of hydrogen ($H_2$), tetrafluoromethane ($CF_4$), and chlorine ($Cl_2$), and the inert gas may include at least one of nitrogen ($N_2$) and argon (Ar). More specifically, the reactive gas may include hydrogen and the inert gas may include argon.

As the method of appropriately forming the roughness Ra on the surface of the metal base material 10, a method of adjusting power of the ion gun may be used. Specifically, the power of the ion gun may be in a range of 3 to 20 kW. When the power of the ion gun is too high, the strongly accelerated inert gas ions are unevenly distributed, and the surface roughness Ra of the metal base material 10 becomes too high. When the power of the ion gun is too small, the oxide film is not properly eliminated or the surface roughness (Ra) of the metal base material 10 becomes too small. More specifically, the power of the ion gun may be in a range of 5 to 15 kW.

An amount of the introduced mixed gas may be in a range of 60 to 100 sccm. When the amount of the introduced mixed gas is too small, the oxide film is not properly eliminated or the surface roughness (Ra) of the metal base material 10 becomes too small. Even if the amount of the introduced mixed gas is further increased, process efficiency thereof is not improved. Specifically, an amount of the introduced inert gas may be in a range of 10 to 50 sccm, and an amount of the introduced reactive gas may be in a range of 30 to 70 sccm.

A vacuum degree of the chamber may be equal to or less than 1 mbar. An appropriate vacuum degree should be maintained to properly eliminate the oxide film.

A temperature of the chamber may be in a range of 200 to 500° C. When the temperature of the chamber is too low, the etching process may not be properly performed. When the temperature of the chamber is too high, a structure in the metal base material 10 may be changed, or the metal base material 10 itself may be deformed.

After etching the surface of the metal base material 10, a process of permeating the carbon diffusion interfering ions into the surface of the metal base material 10 to form the ion permeating layer 20 from the surface of the metal base material 10 toward the inside of the base metal material 10 may further included. The reason for forming the ion permeating layer 20 is described above, so a duplicate description thereof will be omitted.

The forming of the ion permeating layer 20 may be to permeate the carbon diffusion interfering ions through plasma or ion injection.

The method of using the plasma is a method of permeating the carbon diffusion interfering ions into the metal base material 10 by using the plasma in an ion forming gas atmosphere forming the carbon diffusion interfering ions. The ion injection is a method of accelerating ions using high energy to collide with the substrate and permeate to the inside of the base material.

In the case of the method of using the plasma, the ion forming gas means a gas containing the carbon diffusion interfering ions. For example, the gas may include nitrogen gas ($N_2$), borane gas ($B_2H_6$), and the like. The method of using the plasma may be performed in an atmosphere including 10 vol % or more of the ion forming gas. When the ion forming gas is insufficient, the carbon diffusion interfering ions may not be properly permeated. A remaining portion of the atmospheric gas may be hydrogen gas.

The forming of the ion permeating layer 20 may be performed at 300 to 550° C. When a temperature for the forming of the ion permeating layer 20 is too low, the carbon diffusion interfering ions may not be properly permeated. When the temperature of the forming of the ion permeating layer 20 is too high, metal materials of the metal base material 10 and carbon diffusion interfering ions may react with each other, thereby decreasing the corrosion characteristic and increasing the contact resistance. For example, when chromium of the metal base material 10 and nitrogen as the carbon diffusion interfering ions react with each other such that a chromium nitride (CrN, $Cr_2N$) is formed, the corrosion characteristic may decrease and the contact resistance may increase. In the exemplary embodiment of the present disclosure, since the ion permeating layer 20 is formed at a low temperature, there is a difference from a nitriding process in which nitrogen is permeated at a high temperature. Therefore, the temperature may be adjusted in the above-mentioned range.

The forming of the ion permeating layer 20 may be performed for 10 to 120 minutes. When the time is too short, the carbon diffusion interfering ions may not be properly permeated. Even though the time is further increased, there is a limit to the permeated amount of the carbon diffusion interfering ions. Therefore, the time may be adjusted in the above-mentioned range.

Then, the carbon precursor gas is converted into a plasma state to form a carbon coating layer 30 on the surface of the metal base material 10. That is, the carbon coating layer 30 is formed by using a plasma enhanced chemical vapor deposition (PECVD) method. Specifically, the carbon coating layer 30 is formed by exciting the carbon atoms in the carbon precursor gas with plasma.

The forming of the carbon coating layer 30 may be performed in an atmosphere including 3 to 30 vol % of the carbon precursor gas. When a content of the carbon precursor gas is too small, the carbon coating layer 30 is not properly formed. When the content of the carbon precursor gas is too large, a compressive residual stress of the carbon coating layer 30 is increased, thus the carbon coating layer 30 may be delaminated. More specifically, the forming of the carbon coating layer 30 may be performed in an atmosphere including 10 to 20 vol % of the carbon precursor gas. In this case, the carbon precursor gas means a gas capable of exciting carbon atoms by applying plasma thereto. Specifically, it may be a hydrocarbon gas. More specifically, it may include $C_2H_2$, $CH_4$, or $C_2H_6$. In addition to the carbon precursor gas, a remaining portion may be argon or hydrogen gas. Specifically, the $C_2H_2$ gas may be supplied at 1 to 30 sccm, and the argon gas may be supplied at 1 to 100 sccm. In this case, a vacuum degree may be equal to or less than 1 mbar.

The forming of the carbon coating layer 30 may be performed at 200 to 500° C. When the temperature is too low, the carbon coating layer 30 may not be properly formed. When the temperature is too high, chromium carbide ($Cr_7C_3$) is formed, thus the corrosion characteristic may deteriorate. Therefore, the temperature may be adjusted in the above-mentioned range.

Then, the carbon coating layer may be cooled at a cooling rate of 3° C./min or less. In the exemplary embodiment of the present disclosure, it is possible to improve the water discharge characteristic without changing the electrical characteristics of the carbon coating layer 30 by precisely controlling the cooling rate in the cooling process. When the cooling rate is too rapid, the surface roughness (Ra) of the carbon coating layer 30 increases, and the water discharge characteristic deteriorates. More specifically, the carbon coating layer may be cooled at a cooling rate of 1 to 3° C./min.

The cooling process may start at the temperature at which the carbon coating layer 30 is formed. That is, the starting temperature may be in a range of 200 to 500° C. A termination temperature may be in a range of 10 to 150° C.

The cooling process may be performed in an inert gas atmosphere. When it is performed in the inert gas atmosphere, it is possible to prevent oxidation of carbon during the cooling process, thereby improving the electrical conductivity and the corrosion resistance characteristic of the separator for the fuel cell. Specifically, the inert gas atmosphere may be a nitrogen ($N_2$) or argon (Ar) atmosphere. It is possible to adjust the cooling rate by controlling a supply amount of the inert gas. Specifically, the cooling rate may be adjusted by supplying an inert gas of 10 to 30° C. at 100 to 1000 sccm.

Since other descriptions of the metal base material 10, the ion permeating layer 20, and the carbon coating layer 30 have been described in detail with respect to the separator 100 for the fuel cell is described above, a duplicate description thereof will be omitted.

Since the separator 100 for the fuel cell according to the exemplary embodiment of the present disclosure improves the water discharge characteristic while maintaining the electrical conductivity and the corrosion resistance characteristic, it is possible to improve performance of the fuel cell.

Hereinafter, examples of the present disclosure and comparative examples will be described in detail. However, the following examples are for exemplary purposes only, and the scope of the present disclosure is not limited thereto.

Example 1

Figure 3:
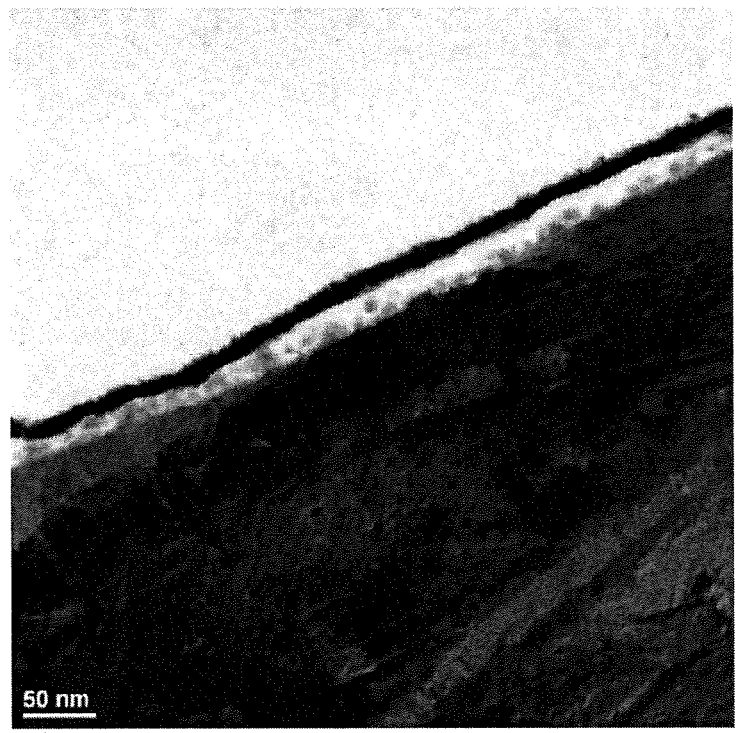
FIG. 3 illustrates a scanning electron microscope (SEM) photograph of a cross-section of a metal base material after being etched in Example 1.

As the metal base material, SUS 316L, which is austenite-based stainless steel, was prepared. It was loaded into the metal base material chamber and heated to 300° C. in the argon atmosphere. Then, while the vacuum degree of the chamber was maintained at 1 mbar, the hydrogen gas was introduced at 60 sccm and argon gas was introduced at 30 sccm, and the ion gun of 5 kW was applied to etch the metal base material. FIG. 3 illustrates a scanning electron microscope (SEM) photograph of a cross-section of the metal base material after being etched. As shown in FIG. 3, it can be confirmed that the surface of the metal base material is relatively smoothly formed.

Next, the metal base material was heated to 400° C. A gas containing 15 vol % of nitrogen and 85 vol % of hydrogen was introduced, and plasma was applied to permeate nitrogen ions for 10 minutes.

The acetylene ($C_2H_2$) was introduced at 30 sccm, the argon gas was introduced at 100 sccm, and the plasma was applied for 30 minutes. Then, the atmospheric gas was changed to nitrogen ($N_2$) gas and cooled to 25° C. at a cooling rate of 1° C./min.

The carbon coating layer with a thickness of 50 nm was formed.

Example 2

Although performed in the same manner as in Example 1, the hydrogen gas was introduced at 40 sccm and the argon gas was introduced at 30 sccm in the etching step, and the ion gun of 15 kW was applied to etch the metal base material.

Comparative Example 1

Although performed in the same manner as in Example 1, the hydrogen gas was introduced at 80 sccm and the argon gas was introduced at 30 sccm in the etching step, and the ion gun of 1 kW was applied to etch the metal base material.

Comparative Example 2

Although performed in the same manner as in Example 1, the hydrogen gas was introduced at 20 sccm and the argon gas was introduced at 30 sccm in the etching step, and the ion gun of 30 kW was applied to etch the metal base material.

Comparative Example 3

Figure 4:
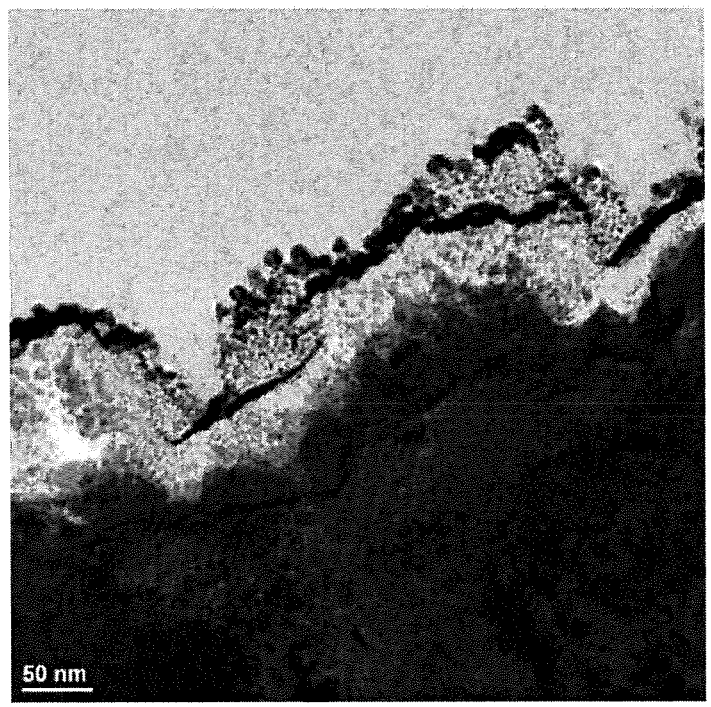
FIG. 4 illustrates a scanning electron microscope (SEM) photograph of a cross-section of a metal base material after being etched in Comparative Example 3.

Although performed in the same manner as in Example 1, the hydrogen gas was introduced at 10 sccm and the argon gas was introduced at 30 sccm in the etching step, and the ion gun of 50 kW was applied to etch the metal base material. FIG. 4 illustrates a scanning electron microscope (SEM) photograph of a cross-section of the metal base material after being etched. As shown in FIG. 4, it can be confirmed that the surface of the metal base material is considerably roughly formed.

Experimental Example 1: Measurement of Interface Roughness and Contact Angle

The interfaces roughness and the contact angles to water with respect to the metal base materials and the carbon coating layers of the separators for the fuel cells prepared in Examples 1 and 2 and Comparative Examples 1 to 3 were measured and are summarized in Table 1.

TABLE 1

| | Example 1 | Example 2 | Comparative Example 1 | Comparative Example 2 | Comparative Example 3 |
|---|---|---|---|---|---|
| Ion gun power (kW) | 5 | 15 | 1 | 30 | 50 |
| Hydrogen gas amount (sccm) | 60 | 40 | 80 | 20 | 10 |
| Argon gas amount (sccm) | 30 | 30 | 30 | 30 | 30 |
| Interface roughness (Ra, nm) | 38 | 76 | 11 | 80 | 104 |
| Advancing angle (°) | 77.5 | 79.4 | 78.3 | 80.5 | 79.6 |
| Receding angle (°) | 67.3 | 65.2 | 73.3 | 45.6 | 43.8 |
| Contact angle hysteresis (°) | 10.2 | 14.2 | 5.0 | 34.9 | 35.8 |

As shown in Table 1, it can be confirmed that the surface roughness of Examples 1 and 2 is small, thus the contact angle hysteresis is small and the water discharge performance is excellent. In contrast, it can be confirmed that the interface roughness of Comparative Examples 2 and 3 is too large, thus the contact angle hysteresis is large and the water discharge performance is deteriorated.

Experimental Example 2: Evaluation of Contact Resistance and Corrosion Current Density The contact resistance and the corrosion current density with respect to the metal base materials and the carbon coating layers of the separators for the fuel cells prepared in Examples 1 and 2 and Comparative Examples 1 to 3 were measured, and the measured results are summarized in Table 1.

The contact resistance was measured by a contact resistance measurer in a state in which the separator and the gas diffusion layer were positioned between two copper plates and then a pressure of 10 kgf/cm$^2$ was applied thereto.

The corrosion current densities were measured using 0.1 N $H_2SO_4$+2 ppm HF solution, and specifically, they were measured in a range of −0.25 to 1 V vs SCE after air bubbling for 1 hour after heating the solution to 65° C., and then the physical properties thereof were comparison-evaluated by using data of an anode environment (0.6 V vs SCE).

TABLE 2

| | Example 1 | Example 2 | Comparative Example 1 | Comparative Example 2 | Comparative Example 3 |
|---|---|---|---|---|---|
| Interface roughness (Ra, nm) | 38 | 76 | 11 | 80 | 104 |
| contact resistance (mΩ · cm$^2$) | 9.3 | 7.8 | 8.8 | 7.4 | 8.7 |
| Corrosion current density (μA/cm$^2$) | 0.38 | 0.23 | 0.74 | 0.22 | 0.12 |

As shown in Table 2, it can be confirmed that the interface roughness of Examples 1 and 2 is appropriately formed, so that the corrosion current density characteristics thereof are excellent. In contrast, it can be confirmed that the interface roughness of Comparative Example 1 is too small, so that the corrosion current density characteristics thereof is deteriorated.

Experimental Example 3: Performance Evaluation of Fuel Cell

A unit stack with five cells was manufactured using the separators for the fuel cells prepared in Examples 1 and 2 and Comparative Examples 1 to 3, and I-V performance of the stack was evaluated under humidification conditions with respective 50% of hydrogen and air based on a cooling water inlet temperature of 65° C. The evaluated results are shown in FIG. 5.

Figure 5:
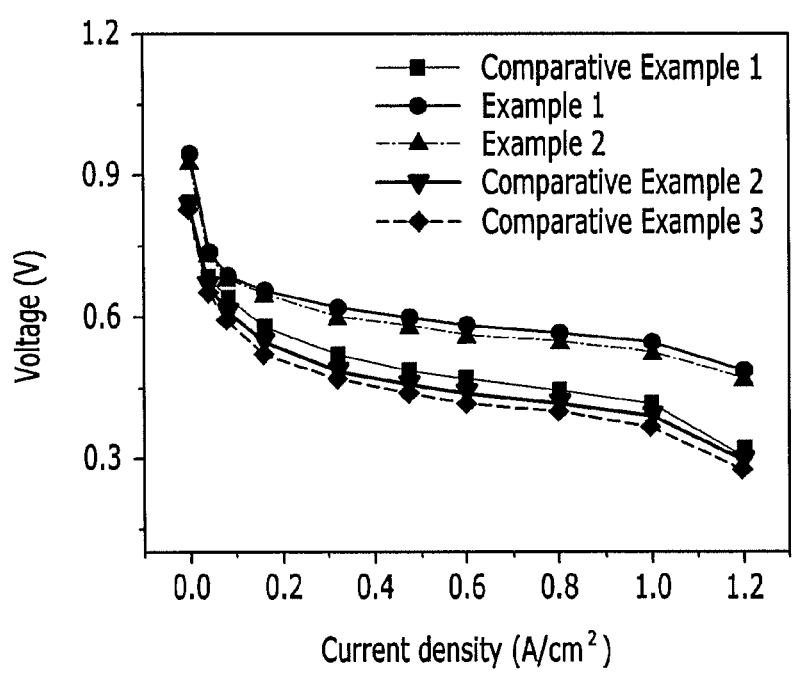
FIG. 5 illustrates a performance evaluation graph with respect to fuel cells to which separators for fuel cells manufactured in Example 1, Example 2, and Comparative Example 1 to Comparative Example 3 are applied.
Figure 6:
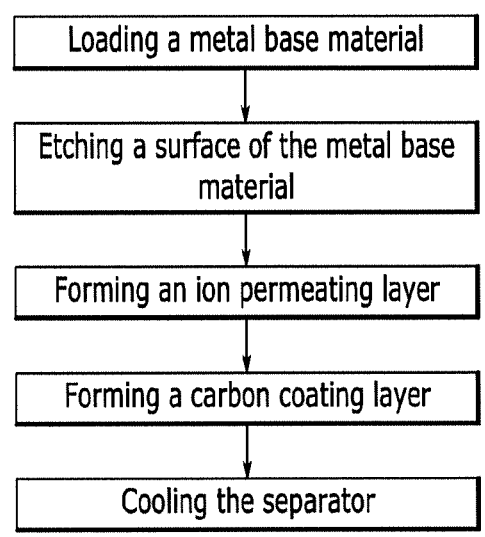
FIG. 6 is a flow chart showing method steps for manufacturing a separator for a fuel cell according to an exemplary embodiment of the present disclosure.

As shown in FIG. 5, it can be confirmed that the fuel cells using the separators for the fuel cells prepared in Examples 1 and 2 have excellent performance. This is because the water discharge characteristic is improved while maintaining the electrical conductivity and the corrosion resistance characteristic of the separators for fuel cells.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A separator for a fuel cell, comprising:
    a metal base material; and
    a carbon coating layer formed on one surface or both surfaces of the metal base material,
    wherein roughness Ra formed at an interface between the metal base material and the carbon coating layer is in a range of 20 to 78 nm,
    wherein the metal base material comprises an ion permeating layer,
    wherein the ion permeating layer includes carbon diffusion interfering ions, and
    wherein the ion permeating layer extends from a surface of the metal base material in an inner direction of the metal base material.

2. The separator for the fuel cell of claim 1, wherein a contact angle of the carbon coating layer with respect to water is in a range of 65 to 80°.

3. The separator for the fuel cell of claim 1, wherein a contact angle hysteresis of the carbon coating layer with respect to water is equal to or less than 20°.

4. The separator for the fuel cell of claim 1, wherein a thickness of the carbon coating layer is equal to or less than 1 μm.

5. The separator for the fuel cell of claim 1, wherein the carbon diffusion interfering ions include nitrogen or boron ions.

6. The separator for the fuel cell of claim 1, wherein a thickness of the ion permeating layer is in a range of 30 to 300 nm.

* * * * *